(12) United States Patent
Black et al.

(10) Patent No.: US 10,079,322 B2
(45) Date of Patent: Sep. 18, 2018

(54) NECKLACES OF SILICON NANOWIRES

(71) Applicant: Advanced Silicon Group, Inc., Lincoln, MA (US)

(72) Inventors: Marcie R. Black, Lincoln, MA (US); Jeffrey B. Miller, Brookline, MA (US); Michael Jura, Santa Monica, CA (US); Claire Kearns-McCoy, Boston, MA (US); Joanne Yim, San Francisco, CA (US); Brian P. Murphy, Revere, MA (US)

(73) Assignee: Advanced Silicon Group, Inc., Lincoln, MA (US)

( * ) Notice: Subject to any disclaimer, the term of this patent is extended or adjusted under 35 U.S.C. 154(b) by 0 days.

(21) Appl. No.: 15/441,744

(22) Filed: Feb. 24, 2017

(65) Prior Publication Data

US 2017/0170346 A1 Jun. 15, 2017

Related U.S. Application Data

(62) Division of application No. 14/764,863, filed as application No. PCT/US2014/013677 on Jan. 29, 2014.

(Continued)

(51) Int. Cl.
*H01L 21/306* (2006.01)
*H01L 31/0352* (2006.01)
(Continued)

(52) U.S. Cl.
CPC ......... *H01L 31/035227* (2013.01); *H01L 21/02068* (2013.01); *H01L 21/288* (2013.01); *H01L 21/2855* (2013.01); *H01L 21/28568* (2013.01); *H01L 21/3081* (2013.01); *H01L 21/30604* (2013.01); *H01L 21/32134* (2013.01); *H01L 29/0676* (2013.01); *H01L 29/16* (2013.01); *H01L 31/028* (2013.01);
(Continued)

(58) Field of Classification Search
CPC ............ H01L 21/0669; H01L 21/0676; H01L 21/306; H01L 21/30604; H01L 21/30608; H01L 21/3063; H01L 21/308–21/3088
See application file for complete search history.

(56) References Cited

U.S. PATENT DOCUMENTS

2002/0172820 A1 11/2002 Majumdar et al.
2003/0132121 A1* 7/2003 Breen ............... B01J 23/72
                                                      205/231

(Continued)

FOREIGN PATENT DOCUMENTS

WO 2012-018678 A1 2/2012

OTHER PUBLICATIONS

Muller et al., 'Ordered arrays of faceted gold nanoparticles obtained by dewetting and nanosphere lithography,' 2008 Nanotechnology, vol. 19, 485306.*

(Continued)

*Primary Examiner* — Bryan Junge
(74) *Attorney, Agent, or Firm* — Lando & Anastasi, LLP

(57) ABSTRACT

In an embodiment of the disclosure, a structure is provided which comprises a silicon substrate and a plurality of necklaces of silicon nanowires which are in direct physical contact with a surface of the silicon substrate, wherein the necklaces cover an area of the silicon substrate.

15 Claims, 9 Drawing Sheets

Related U.S. Application Data

(60) Provisional application No. 61/758,474, filed on Jan. 30, 2013.

(51) Int. Cl.

| | | |
|---|---|---|
| *H01L 21/285* | (2006.01) | |
| *H01L 29/06* | (2006.01) | |
| *H01L 29/16* | (2006.01) | |
| *H01L 21/02* | (2006.01) | |
| *H01L 21/288* | (2006.01) | |
| *H01L 21/3213* | (2006.01) | |
| *H01L 31/0224* | (2006.01) | |
| *H01L 31/028* | (2006.01) | |
| *H01L 31/18* | (2006.01) | |
| *H01L 21/308* | (2006.01) | |
| *B82Y 20/00* | (2011.01) | |
| *B82Y 30/00* | (2011.01) | |
| *B82Y 40/00* | (2011.01) | |

(52) U.S. Cl.
CPC .. *H01L 31/022408* (2013.01); *H01L 31/1804* (2013.01); *B82Y 20/00* (2013.01); *B82Y 30/00* (2013.01); *B82Y 40/00* (2013.01); *Y10S 977/762* (2013.01); *Y10S 977/814* (2013.01); *Y10S 977/834* (2013.01); *Y10S 977/888* (2013.01); *Y10S 977/891* (2013.01); *Y10S 977/892* (2013.01); *Y10S 977/948* (2013.01)

(56) References Cited

U.S. PATENT DOCUMENTS

| | | | |
|---|---|---|---|
| 2009/0142558 A1 | 6/2009 | Jiao et al. | |
| 2009/0217971 A1 | 9/2009 | Guha et al. | |
| 2009/0256134 A1 | 10/2009 | Buchine et al. | |
| 2010/0248449 A1* | 9/2010 | Hildreth | B81C 1/00071 |
| | | | 438/460 |
| 2012/0119760 A1* | 5/2012 | Pehrsson | H01L 29/0665 |
| | | | 324/691 |
| 2013/0040412 A1* | 2/2013 | Park | H01M 4/134 |
| | | | 438/49 |
| 2013/0136894 A1* | 5/2013 | Baker | B32B 33/00 |
| | | | 428/141 |
| 2013/0171413 A1* | 7/2013 | Khan | B81C 1/00206 |
| | | | 428/141 |
| 2014/0335411 A1* | 11/2014 | Liu | C23C 18/1601 |
| | | | 429/218.1 |

OTHER PUBLICATIONS

Lee et al., 'Strategies for controlling Si nanowire formation during Au-assisted electroless etching,' 2011, J. Mater. Chem. vol. 21, 10359.*

Niu, H. et al., "Amphiphilic ABC Triblock Copolymer-Assisted Synthesis of Core/Shell Structured CdTe Nanowrites", Langmuir, vol. 21 No. 9, Feb. 2005.

Yano, K. et al., "Rapid Thermal Annealing of FePt nanoparticles", J. Appl. Phys., vol. 104, 13918, Jul. 2008.

Search Report from corresponding International Application PCT/US2014/013677 dated Jun. 10, 2014.

Zhipeng et al., 'Metal-assisted chemical etching of silicon: A review,' 2011, Adv. Mater. vol. 23, pp. 285-308.

Lugstein et al., 'Pressure-induced orientation control of the growth of epitaxial silicon nanowires,' 2008, Nano Letters, vol. 8 No. 8, pp. 2310-2314.

Peng et al., 'Fabrication of single-crystalline silicon nanowires by scratching a silicon surface with catalytic metal particles,' 2006, Adv. Fund. Mater. vol. 16, pp. 387-394.

Koynov et al., "Black multi-crystalline silicon solar cells", Phys. Stat. Sol. (RRL), 1, No. 2, R53-R55 (2007).

Koynov et al., "Black nonreflecting silicon surfaces for solar cells", Applied Physics Letters, 88, 203107 (2006).

* cited by examiner

NECKLACES OF SILICON NANOWIRES

CROSS-REFERENCE TO RELATED APPLICATIONS

This application claims priority under 35 U.S.C. § 121 as a division of U.S. patent application Ser. No. 14/764,863, filed Jul. 30, 2015 which is a U.S. National Phase Application under 35 U.S.C. § 371 of International Application No. PCT/US2014/013677, filed Jan. 29, 2014, which claims the benefit of U.S. Provisional Application No. 61/758,474, filed Jan. 30, 2013, the contents of which are incorporated herein by reference in their entirety.

BACKGROUND OF THE INVENTION

Nanowire arrays are seeing increasing use in a variety of applications. See, e.g., U.S. Published Patent Application No. 2009/256134. An exemplary silicon nanowire array might consist of a collection of silicon nanowires, on the order of 100 nm in diameter, on the rough order of one micrometer in height, and of approximately cylindrical or frustoconical shape. The axes of the nanowires run approximately parallel to each other. Each is attached at an end to a silicon substrate.

A silicon nanowire array on top of a silicon substrate, can alter the opto-electrical properties of the bulk silicon substrate. For example, a silicon nanowire array may reduce the reflection of the silicon substrate, reduce the reflection at off-angles of incidence, and increase the absorption of the silicon in ways similar to traditional pyramids or light trapping mechanisms used in solar cells.

A common method for growing silicon nanowires is metal-enhanced etching of a silicon-containing substrate. This is discussed, for example, in U.S. Patent Application No. 2009/256134 where further references are provided. In metal-enhanced etching, a metal is deposited on top of a silicon substrate and placed in a solution in which the etch is enhanced wherever the silicon touches metal. Since the metal coverage is not uniform, parts of the silicon are not etched leaving a graded index silicon, cliffs, or nanowires. The metal used can be, for example, gold, platinum, or silver.

Other known processes for obtaining silicon nanowires include reactive ion etching and VLS (vapor-liquid-solid). In VLS, nanowires are commonly grown on a substrate using a metal catalyst and silane.

There is a need to further improve the process by which arrays of silicon nanowires can be formed.

SUMMARY OF THE INVENTION

In an embodiment of the disclosure, a structure is provided which comprises a silicon substrate and a plurality of necklaces of silicon nanowires which are in direct physical contact with a surface of the silicon substrate, wherein the necklaces cover an area of the silicon substrate.

DETAILED DESCRIPTION OF THE INVENTION

Before describing the present invention in detail, it is to be understood that this invention is not limited to specific solvents, materials, or device structures, as such may vary. It is also to be understood that the terminology used herein is for the purpose of describing particular embodiments only, and is not intended to be limiting.

Where a range of values is provided, it is intended that each intervening value between the upper and lower limit of that range and any other stated or intervening value in that stated range is encompassed within the disclosure. For example, if a range of 1 µm to 8 µm is stated, it is intended that 2 µm, 3 µm, 4 µm, 5 µm, 6 µm, and 7 µm are also disclosed, as well as the range of values greater than or equal to 1 µm and the range of values less than or equal to 8 µm.

In an embodiment of the disclosure, a structure is provided which comprises a silicon substrate and a plurality of necklaces of silicon nanowires which are in direct physical contact with a surface of the silicon substrate, wherein the necklaces cover an area of the silicon substrate.

Figure 4:
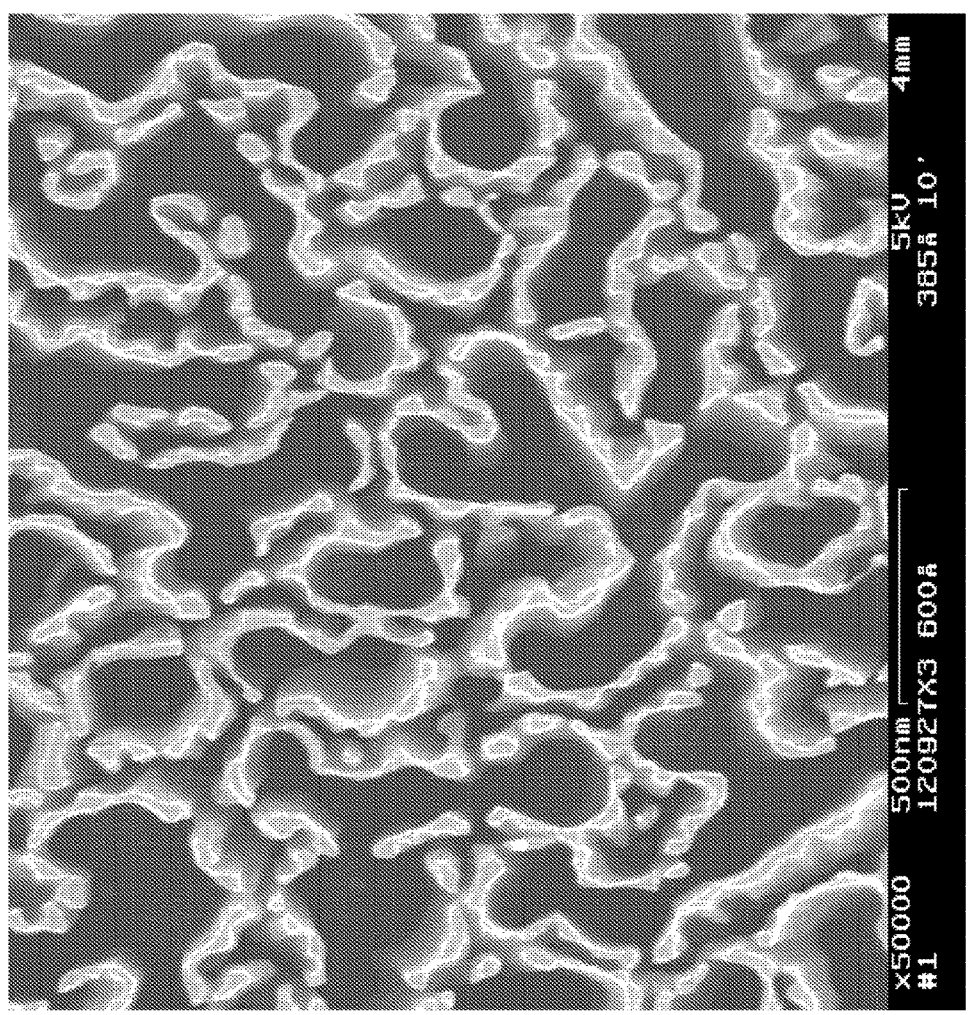
FIG. 4 is a top view SEM of a nanowire array formed by Exemplary Process 1.
Figure 5:
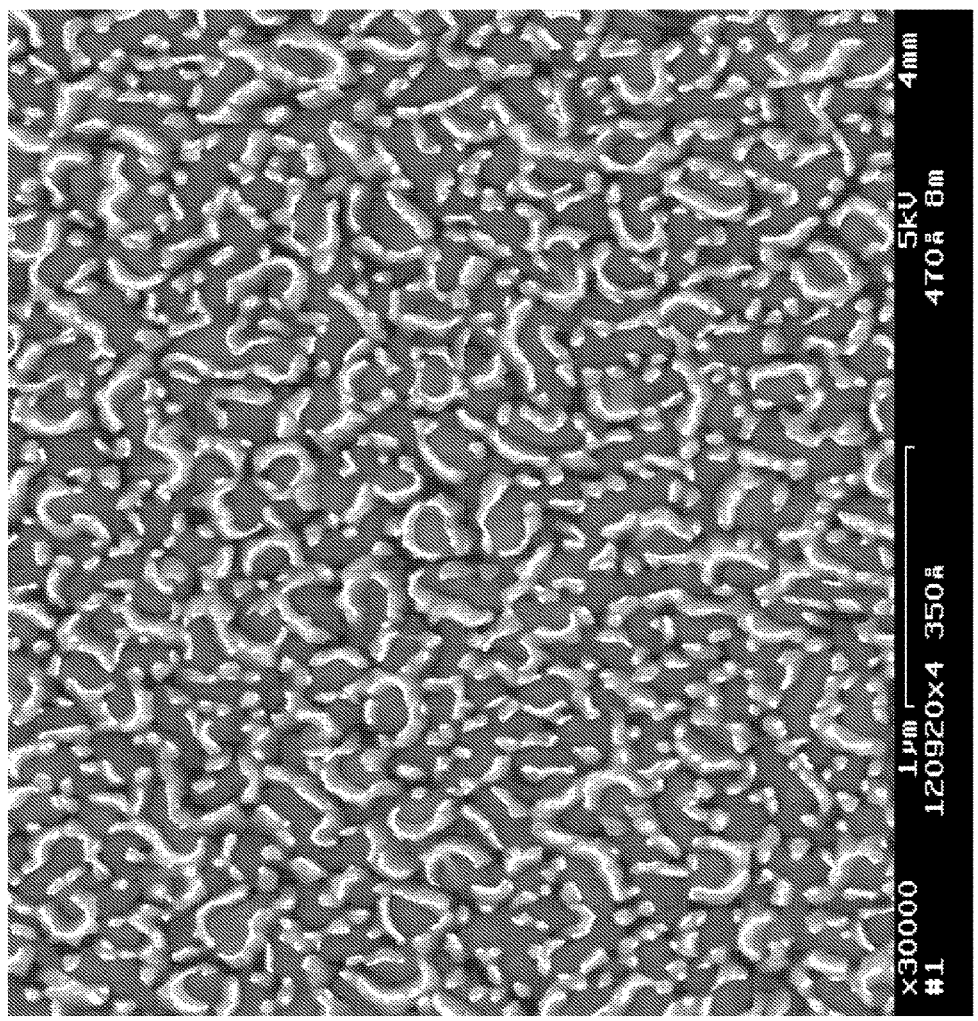
FIG. 5 is a top view SEM of a second nanowire array formed by Exemplary Process 1.
Figure 6:
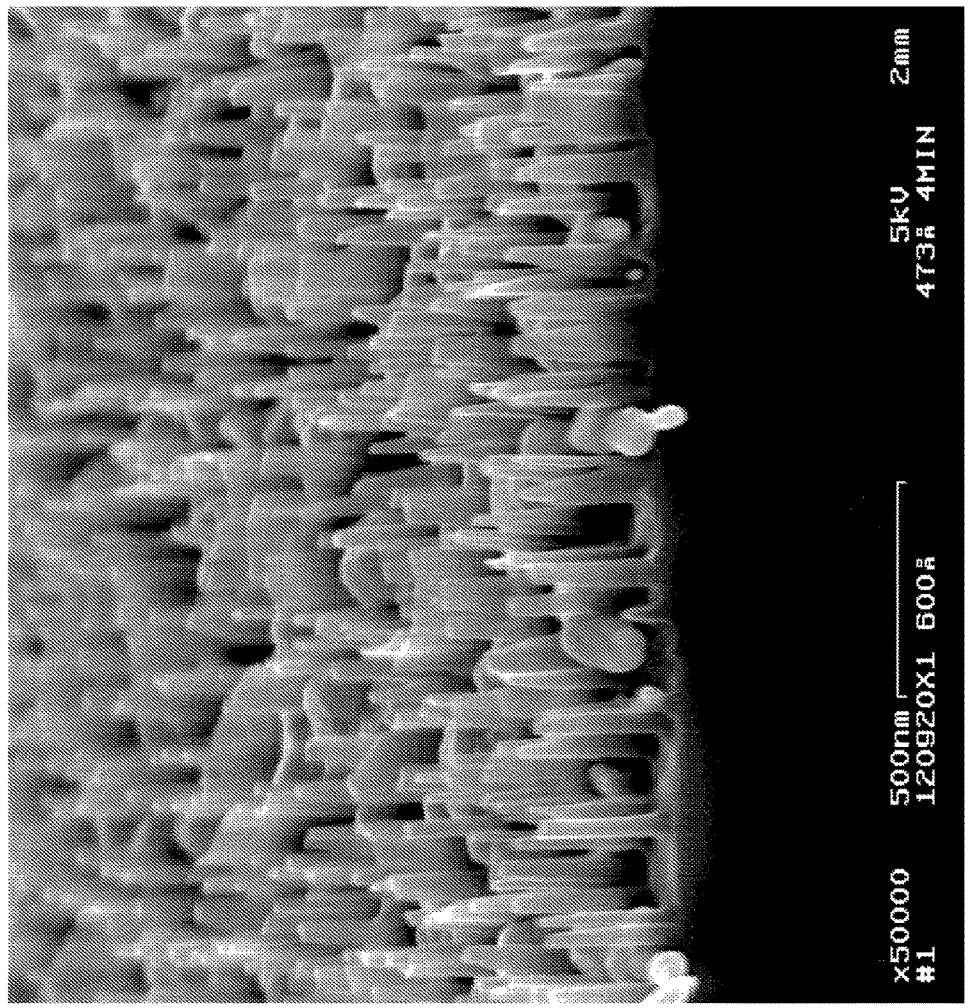
FIG. 6 is tilted top view SEM image of a nanowire array formed by Exemplary Process 1.

The necklaces include sets of silicon nanowires which are arranged along a potentially curved line segment in the plane of the surface of the silicon substrate. Exemplary necklaces are depicted in FIGS. 4 and 5 in a top view and in FIG. 6 in a slanted view. The curved line segment along which the nanowires of a necklace are arranged may be visualized as the necklace's "footprint." The curved line segment may branch and may be or comprise a closed curve. The curved line segment along which the silicon nanowires are arranged may be circular in shape or it may be of more irregular shape, as may be seen in FIGS. 4 and 5. The curved line segment may have limited curvature, such that its radius of curvature is at each point greater than a minimum. The minimum may be, for example, about 5 nm, about 10 nm, about 15 nm, about 20 nm, or about 25 nm.

Figure 7:
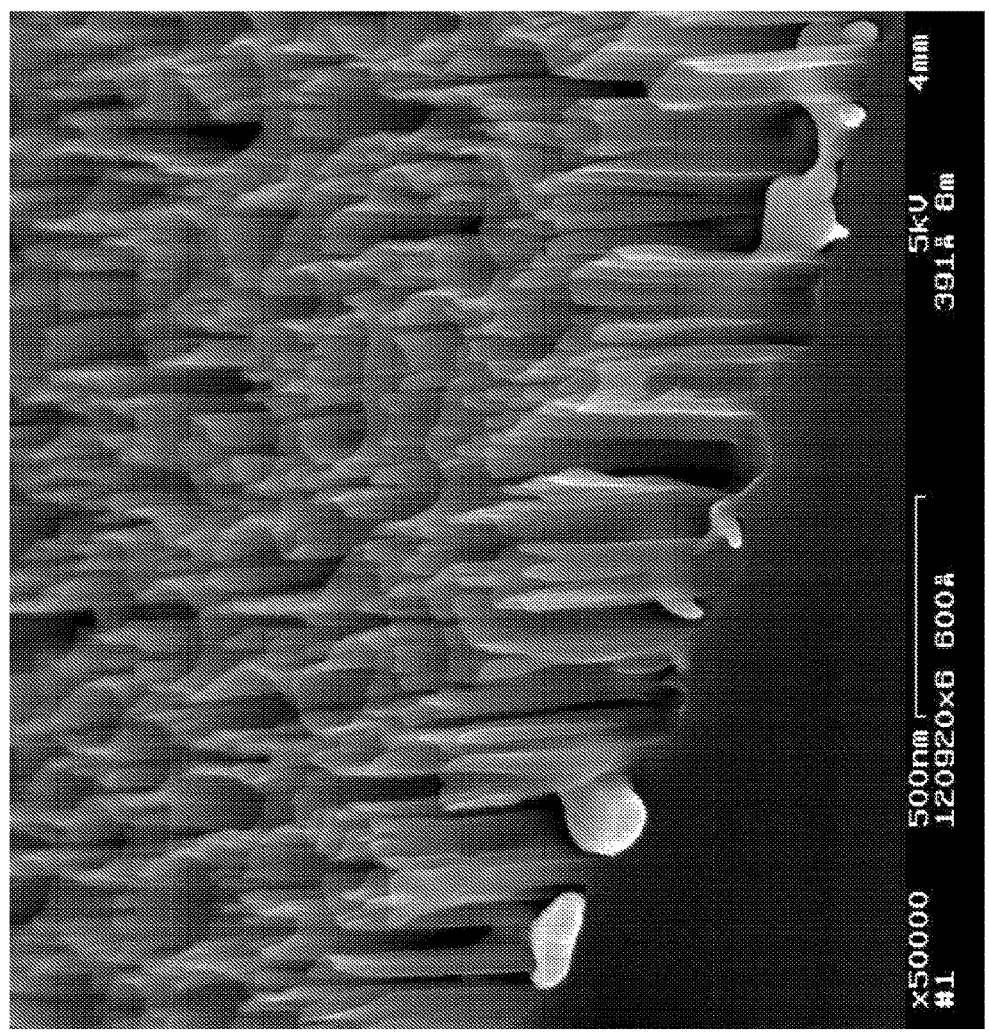
FIG. 7 is tilted top view SEM image of a nanowire array formed by a variant of Exemplary Process 1.
Figure 9:
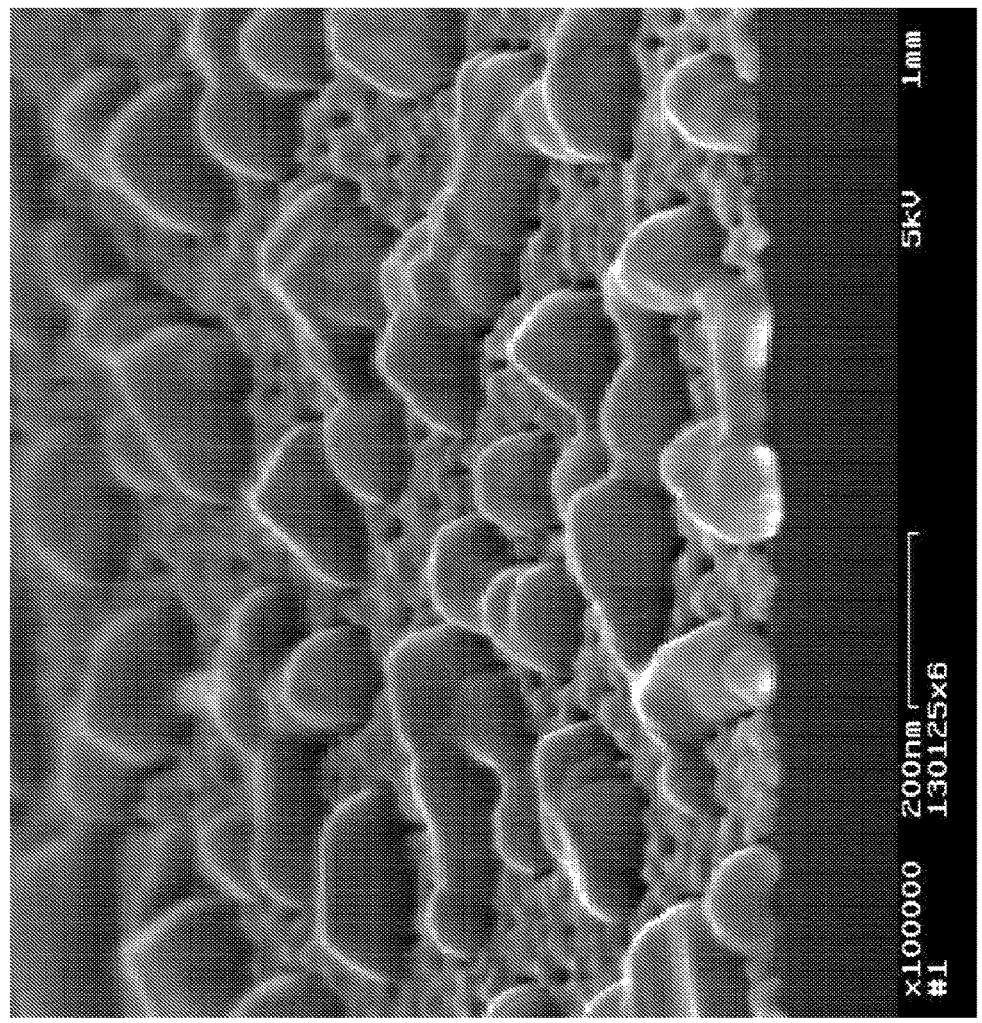
FIG. 9 is a tilted top view SEM image of a wafer after the second deposition step.

The nanowires in a necklace may be joined to walls of silicon between them as shown in FIG. 9. The walls may be lower than the nanowires. The nanowires may also be joined to each other. A necklace of joined nanowires may be a continuous wall with only small projections, or no projections, at the upper edge. FIG. 7 depicts necklaces of this type, which could also be described simply as walls of silicon. In the context of this application, the term height of a nanowire is used to denote the distance from tip to substrate along the nanowire's long axis rather than the height of the tip's projection above a wall of the type just discussed.

The nanowires, while very roughly round, may be thicker in the direction tangential to the curved line segment along which they are arranged. They may deviate from roundness in other ways. Such varying thickness may result, for example, in an average thickness in the direction perpendicular (normal) to the curved line segment along which they are arranged being no more than about 75%, no more than about 50%, or no more than about 35% of the average of the nanowires' diameters.

The nanowires may be tapered in the direction of their long axes. Desirable taper angles might be, for example, no more than about 0.5 degrees, about 1 degree, about 2 degrees, about 4 degrees, or about 10 degrees, or in a range between about 0.5 degrees and about 1 degree, about 2 degrees, about 4 degrees, or about 10 degrees.

The nanowires of the necklaces may be, for example, at least about 100 nm, 200 nm, 300 nm, 400 nm, 500 nm, 700 nm or 1 µm tall. They may have thicknesses in the direction perpendicular to the curved line segment which are, for example, no more than about 5 nm, 10 nm, 15 nm, 25 nm, 50 nm, 75 nm, 100 nm, 200 nm, or 400 nm.

The curved line segments of the nanowire necklaces of the invention may be, for example, at least about 50 nm in length, at least about 100 nm in length, at least about 200 nm in length, at least about 400 nm in length, at least about 600 nm in length, at least about 1 µm in length, at least about 2 µm in length, or at least about 5 µm in length. The structure with necklaces of silicon nanowires may comprise a surface of black silicon comprising necklaces. The reflectivity of such a surface may be, for example, between about 1% and about 5%, or between about 3% and about 15%, prior to the application of an antireflection coating. In certain applications, as for example in photovoltaic applications, there may not be a need for an antireflection coating, with the nanostructuring being sufficient to achieve a desirably low reflectivity.

The structure with necklaces of silicon nanowires may, for example, exhibit a grading of the index of refraction. This may result, for example, from the fact that as one approaches the substrate, the percentage of silicon versus other material (e.g., air) in a plane parallel to the substrate increases. For example, when one is above the nanowires, the percentage of silicon in such a plane parallel to the substrate is zero. The percentage then rises above zero as one reaches the level of the nanowires. The percentage keeps increasing as one approaches the substrate. Then, when one reaches the substrate, the percentage of silicon jumps to its full bulk value (e.g., 100% for pure silicon). As a result of the increase of the percentage of silicon as one approaches the substrate in a direction perpendicular to the substrate, the index of refraction may also be expected to vary as one approaches the substrate in such a direction. The percentage of silicon just prior to the jump to full bulk value is a measure of the density of the nanowires. It may be, for example, less than about 5%, less than about 10%, less than about 25%, or less than about 60%; it may be, for example, greater than about 5%, greater than about 10%, greater than about 25%, or greater than about 60%. The percentage of silicon at the average nanowire height is an alternative measure of the nanowire density. It may be, for example, less than about 5%, less than about 10%, less than about 25%, or less than about 40%; it may be, for example, greater than about 5%, greater than about 10%, greater than about 25%, or greater than about 40%.

The structure with necklaces of silicon nanowires will generally be porous in the sense of having a relatively high ratio of surface area to volume in the portion lying above the bulk of the substrate.

The structure with necklaces of silicon nanowires may form part of a photovoltaic cell. As will be understood by those of skill in the art, a photovoltaic cell usually requires the formation of a p-n junction. Such a junction may be formed in the silicon nanowires or in the substrate below the silicon nanowires. The junction may be formed by a variety of doping technologies known to those of skill in the art. The photovoltaic application also requires contacts to be made to the front and back sides of the p-n junction. A variety of approaches may be taken to those contacts, as described for example in U.S. patent application Ser. No. 13/622,864 assigned to the present assignee.

The structure of the invention has other potential applications besides photovoltaics. It can in principle be employed wherever reasonably dense silicon nanowires are to be used, for example in the applications described in U.S. Published Patent Application No. 2009/256134.

In a further aspect of the present disclosure, a class of processes is provided. Nanoparticles comprising a first metal are deposited on the surface of a silicon-containing substrate. A layer of a second metal is deposited on top of the nanoparticles and silicon in such a way that the deposited metal is blocked from touching silicon or not present in an area near the nanoparticles which were deposited. The metallized substrate is contacted with an etchant aqueous solution comprising about 2 to about 49 weight percent HF and an oxidizing agent. The process causes etching to occur both in areas touched by the nanoparticles and in areas touched by the second metal.

The nanoparticles may be deposited preformed. Alternatively, they may be deposited by first putting down a layer of the first metal and then causing that layer to agglomerate. It is also possible in some cases to carry out a deposition process under conditions in which the first metal agglomerates as it is being deposited, for example using silver nitride solution. The first metal may, for example, form structures referred to as islands.

Where an agglomeration step is performed, it may be carried out by heating the substrate with the deposited first metal. An agglomeration step may also be referred to as annealing. The heating may take place in a chamber used for deposition, for example in the sputtering tool if the first metal was sputtered. The heating may alternatively take place in a separate chamber or oven. The heating may be carried out, for example, at a temperature of at least about 200° C., at least about 250° C., at least about 300° C., at least about 350° C., or at least about 400° C. The heating may be carried out, for example, for a time on the order of minutes, for example between about 1 and about 15 minutes, about 2 and 10 minutes, or about 3 and 7 minutes.

Figure 2:
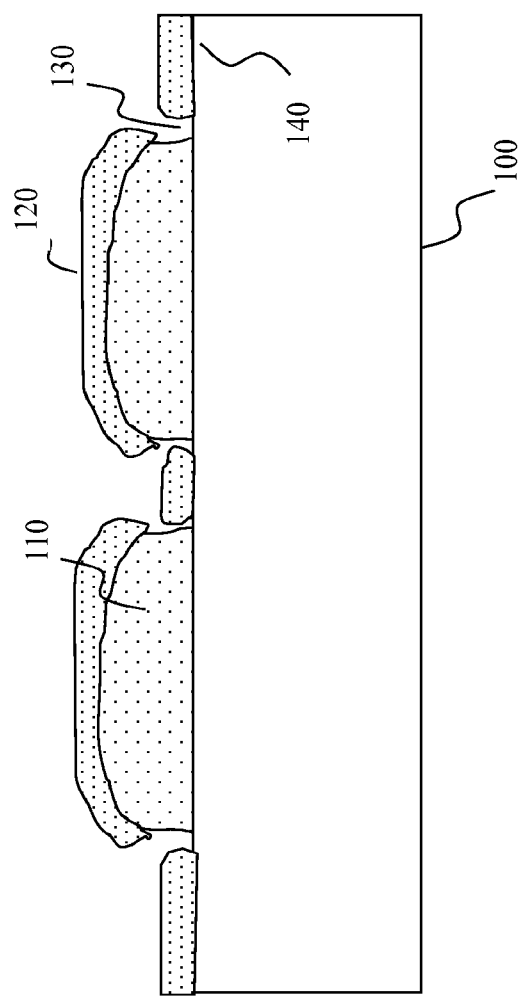
FIG. 2 schematically depicts a cross-sectional view of a wafer after the second deposition step.
Figure 3:
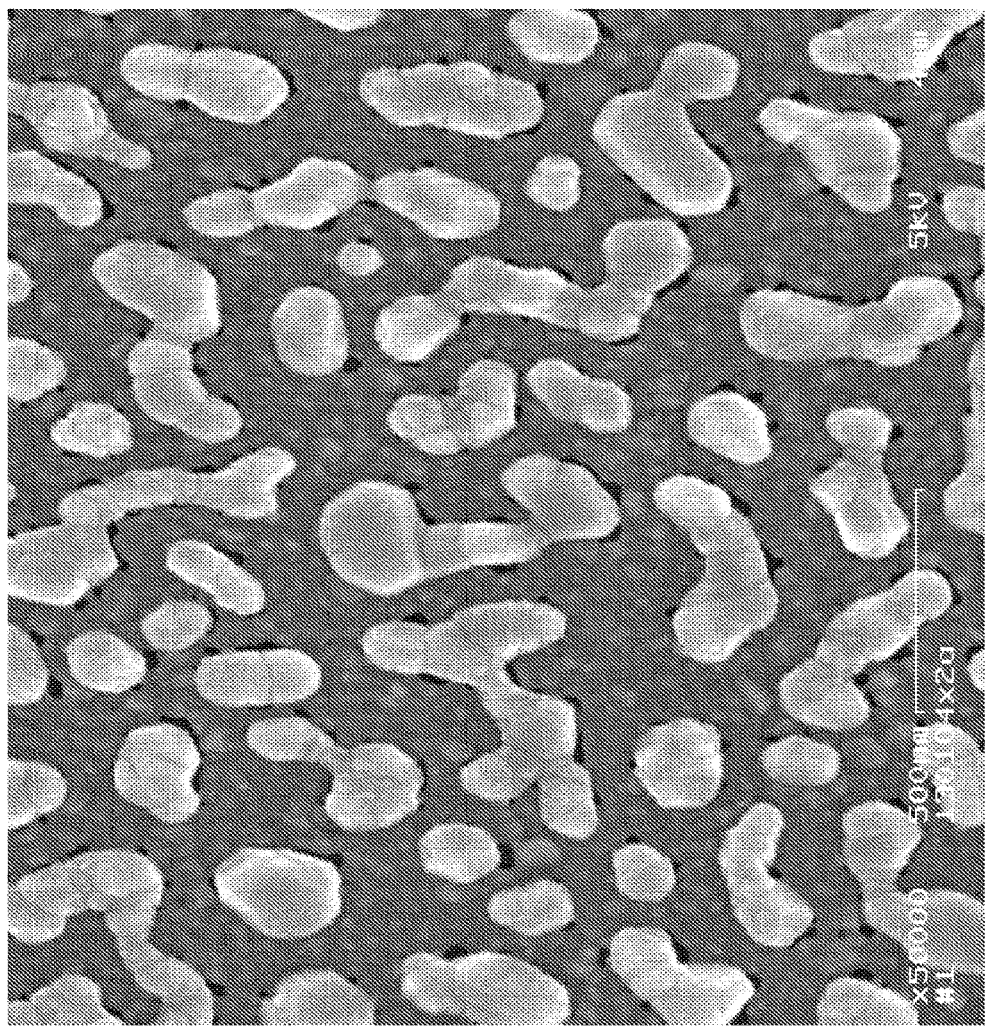
FIG. 3 is an SEM top view of a sample after the second layer of silver is deposited but before the metal-enhanced etch is performed.

The second metal deposition may be carried out by suitable deposition techniques which may include physical and chemical forms of deposition. The second metal deposition forms a layer which lies above nanoparticles. FIG. 9 is a slanted view of the result of deposition above the nanoparticles. FIG. 2 is a schematic cross-section of what is believed to be present once the second layer is deposited. There is a substrate 100. Atop that substrate there are nanoparticles comprising the first metal, such as 110. Atop the nanoparticles there is a layer 120 of the second metal. There are areas like 130 in which the silicon appears to be exposed. Alternatively, even if the silicon is not entirely exposed in areas like 130, the covering of the second metal layer may be quite sparse, thin, and potentially non-continuous in such areas. The areas 130 are adjacent to areas like 140 in which the silicon is more fully covered by the second metal. It is believed that the formation of areas like 130 and 140 may result from Ostwald ripening which involves the deposited metal moving on the surface of the silicon shortly after or during deposition.

The deposition of nanoparticles patterns like those depicted in FIGS. 1, 2, 3 and 9 is helpful for the etching of nanowires. However, it may have other applications since it is a general technique suitable for producing a particular type of nanostructured metal deposition atop a surface. As may be seen in FIGS. 1, 3, and 9, the deposited nanostructures may be like a single ball or may have an appearance which may be reminiscent of a worm or of a rounded structure like a range of rounded hills or a set of balls of clay attached to each other.

An appropriate etch is enhanced where a suitable (e.g., catalytic) metal such as silver touches the silicon, and is less in areas without such a metal. Generally speaking, such an etch leaves nanowires around the deposited, agglomerized metal particles in the areas where the second metal is thin or absent, etching away other areas. It is believed that the second metal may migrate further during the etch increasing the areas where it is thin or absent and where etch is consequently lessened or avoided. The thicknesses of material deposited in the first and second layers are commonly adjustable, e.g., manipulating deposition parameters. The thickness affects the size and spacing between the deposited nanostructures and the size and spacings of the resulting nanowires.

The metal-assisted etching step may be carried out in a variety of conditions and with the use of a range of oxidants, as described for example in U.S. Published Patent application No. 2009/256134 to the present assignee. Exemplary oxidants are $H_2O_2$ and oxygen gas bubbled through the solution comprising HF. Milder or less mild oxidants may be desired according to the character of the etching which results. As described in U.S. Published Patent application No. 2009/256134, an additional etch may also be employed.

In the processes as described in this application, no use need be made of patterning by means of photolithography. While additional photolithographic steps are not excluded, it is believed that the process of agglomerization as described forms adequate nanosized patterns in many circumstances, which patterns are often suitable for metal-enhanced etching of useful nanostructures, providing adequate control for many applications without the need for the expense of photolithography.

Figure 8:
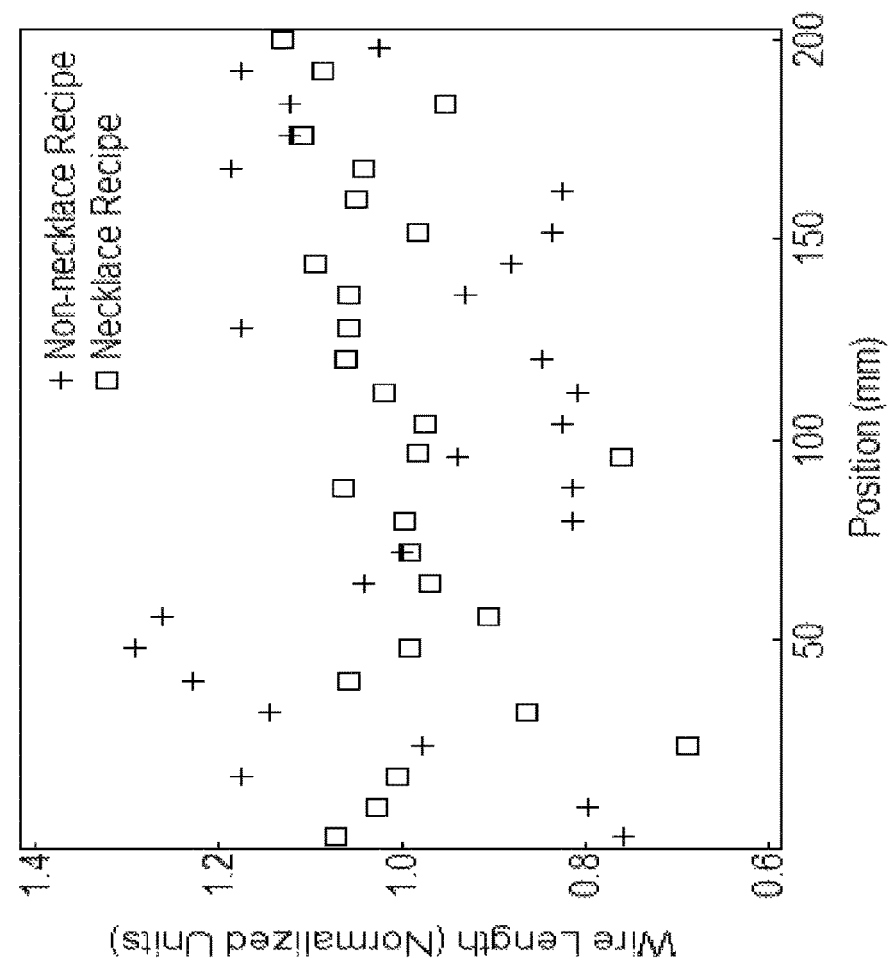
FIG. 8 depicts the distribution of nanowire lengths as a function of position for both a necklace-producing process and a similar non-necklace producing process.

In certain processes of the disclosure, an advantageous level of uniformity of the nanowires is achieved. The solar industry uses 156×156 mm² wafers, and thus uniformity across this area is desirable for solar cell manufacturing. Solution based processes and physical vapor deposition processes for the laying down of metal tend to encounter difficulty producing nanowires over this area. The solar industry uses 156×156 mm² wafers, and thus uniformity across this area is important for solar cell manufacturing. Unfortunately, neither the solution based processes nor the physical vapor deposition processes can uniformly produce nanowires over this area. Of these methods, sputtering gives the most uniform nanowire arrays, but manufacturing grade sputtering tools may vary by ±10% across a 6 inch area. Processes of the disclosure, with two metal deposition steps, are believed to be capable of compensating at least in part for this difficulty. FIG. 8 depicts the distribution of nanowire lengths as a function of position for both a necklace-producing process and a similar non-necklace producing process. The two processes are normalized to the same average nanowire length.

In what follows, exemplary processes of the disclosure are described. The following examples are put forth so as to provide those of ordinary skill in the art with a more complete disclosure and description of how to implement the invention, and are not intended to limit the scope of what the inventors regard as their invention. Efforts have been made to ensure accuracy with respect to numbers (e.g., amounts, temperature, etc.) but some errors and deviations should be accounted for.

Exemplary Process 1

Silicon material with a resistivity of 5 ohm-cm is selected having a surface with a (100) crystallographic orientation and p-type doping.

The first step is to do a saw damage removal process on the wafers. The saw damage removal comprises precleans and a KOH etch that removes the damage caused by forming the wafers. This is performed by first cleaning the wafers in a Piranha solution for 10 minutes. The Piranha step of this exemplary process employs 4 parts 96% sulfuric acid ($H_2SO_4$) and 1 part 30% hydrogen peroxide ($H_2O_2$) at elevated temperature. Prior to placing the wafer into the piranha solution, the latter is bubbled with $N_2$ for 2 minutes. The bubbling is then continued and the wafer is submerged for 10 minutes. The solution is heated from the exothermic reaction. After the piranha etch, the wafer is cleaned 3 times with DI (deionized) water.

Next the wafers are dipped for 1 minute in 4 weight percent hydrofluoric acid (HF) solution to etch off the oxide formed during the Piranha clean. After the HF clean the wafers are removed and again rinsed three times and placed into a spin rinse dryer.

Next a polish etch is performed for 10 minutes in a solution of 1 part DI water, 1 part 30% potassium hydroxide (KOH) at about 70° C. The wafers are then rinsed three times in DI water. The wafers are then cleaned again with Piranha for 10 minutes and rinsed with water three times.

After the saw damage removal, the next step is to do a UV/Ozone clean in order to clean off any residue from the polish etch. The samples are pretreated with a 1 minute dip in an aqueous solution of about 4 weight percent HF. The HF dip removes the oxide formed during the Piranha etch. The wafers are rinsed three times and dried in a spin rinse dryer. The wafers are then placed in the UV/Ozone for 10 minutes at 400° C. with about 1 L/min of oxygen flowing through the chamber.

After the UV/Ozone clean, the sample is immediately placed into a sputtering chamber for the deposition of the first layer of silver. The sample is preferably placed in the sputtering chamber within 10 minutes of the UV/Ozone. The base pressure in the chamber is pumped down to $7.0 \times 10^{-7}$ Torr and then 50 nm of silver (Ag) is sputter deposited on the front of the wafer at a rate of about 8 Å/s at a pressure of 5 mTorr. The samples are then removed from the chamber.

Figure 1:
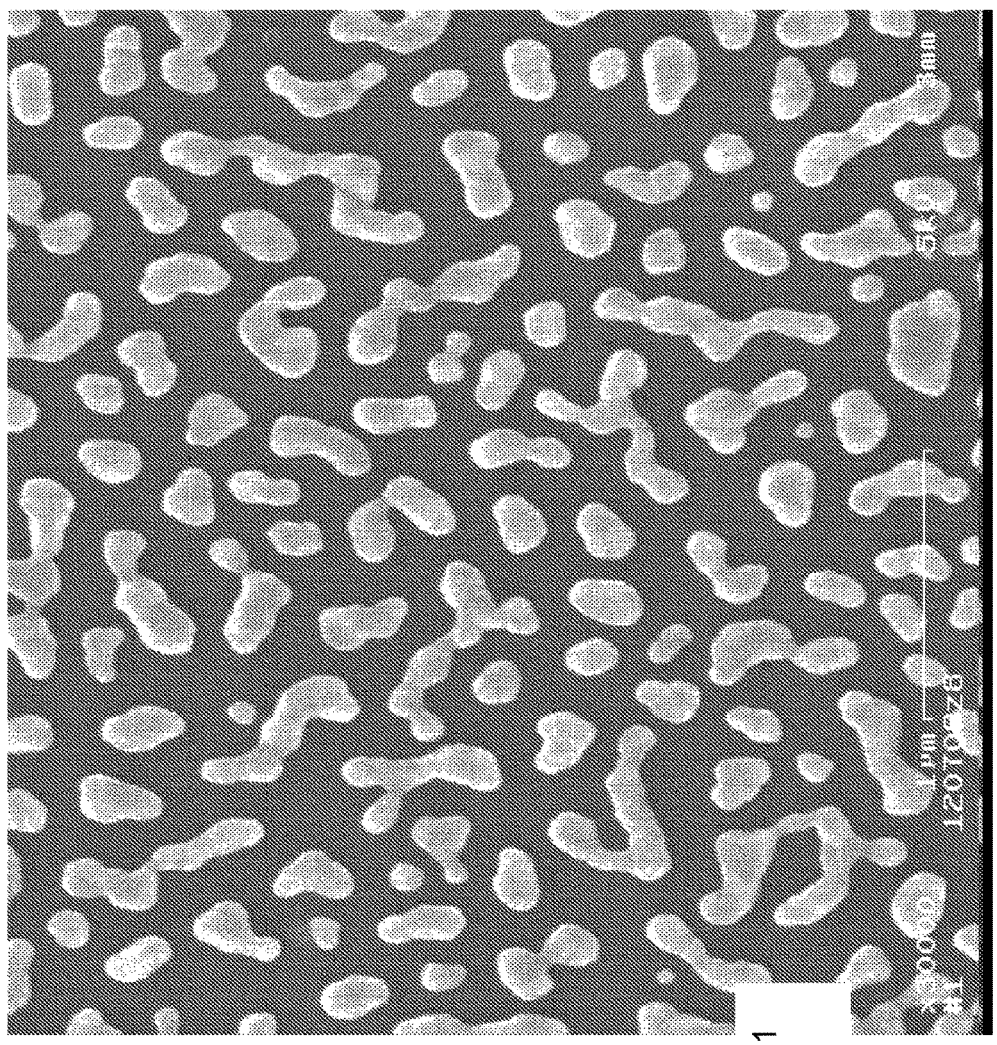
FIG. 1 depicts silver on a silicon substrate after annealing in the box furnace as described in Exemplary Process 1.

The next step is to heat the layer of metal so that it coalesces and agglomerates on the surface forming into ball-like nanoparticle structures distributed more-or-less evenly on the surface of the wafer. The heating process can be done in situ in the sputtering tool or the sample can be removed from the sputtering tool and annealed in an oven or a furnace. For example, the samples may be removed from the sputtering tool and placed in a box furnace. The samples are then heated on a quartz plate at 300° C. for 5 minutes. FIG. 1 shows a picture of the silver on the silicon surface after this heating step.

When this heating step is performed outside of the sputtering tool, the wafers are then returned to the sputtering chamber. A second silver film is then sputtered onto the front surface. 36 nm of silver are deposited at a rate of about 12 Å/s and a pressure of 5 mTorr. This deposition results in coating of both the silver particles and the bare silicon left after the silver has been agglomerated. A schematic of a cross section of the particles is shown in FIG. 2. The silver is very thin in an area immediately surrounding the silver particles from the first deposition, leaving a ring of sparse or bare silicon around each of the silver particles shown, for example, in FIG. 1.

The wafers are then removed from the sputtering chamber and etched to form nanowires. The nanowire formation occurs in an oxygen/HF bath. After the sample is removed from the sputtering chamber, it is placed in a dilute hydrofluoric acid (HF) bath. The bath contains 10 parts volume water to 1 part volume HF. The sample is etched in the HF bath for 10 minutes during which time oxygen is bubbled vigorously through the HF using a perforated teflon tube. After that, the sample is rinsed three times in DI.

The silver is then removed and the sample is cleaned in a series of wet baths. The first bath is a piranha clean which consists of 4 ml of sulfuric acid ($H_2SO_4$) to 1 ml of 30 wt % hydrogen peroxide ($H_2O_2$) at an elevated temperature around 70° C. Prior to placing the wafer into the piranha, the bath is bubbled for 2 minutes. The bubbling is then continued and the wafer is submerged for 2 minutes. After the piranha etch, the wafer is cleaned 3 times with DI water. The sample is then placed in dilute HF for 30 seconds. This HF solution has a volume ratio of 24:1 of water to 49% HF and is at room temperature. The wafer is then rinsed three times with DI water and dried in the spin rinse dryer.

The following references may be relevant to this application: (1) Sami Franssila, *Introduction to Microfabrication* (2d ed. John Wiley & Sons 2010). (2) U.S. Published Patent Application No. 2009/256134. (3) U.S. patent application Ser. No. 13/622,864, published as 2013/99345. (4) H. Galinski et al., "Agglomeration of Pt thin films on dielectric substrates," *Phys. Rev. B*, 82, 235415 (2010). (5) Feng-Ming Liu & Mino Green, "Efficient SERS substrates made by electroless silver deposition into patterned silicon structures," *J. Mater. Chem.*, 14, 1526-1532 (2004). (6) D. W. Pashley et al., "The growth and structure of gold and silver deposits formed by evaporation inside an electron microscope," *Phil. Mag.*, 10:103, 127-158 (1964).

All patents, patent applications, and publications mentioned in this application are hereby incorporated by reference in their entireties. However, where a patent, patent application, or publication containing express definitions is incorporated by reference, those express definitions should be understood to apply to the incorporated patent, patent application, or publication in which they are found, and not to the remainder of the text of this application, in particular the claims of this application.

The invention claimed is:

1. A process for etching a silicon-containing substrate to form nanowires, comprising the steps of:
    (a) depositing a first metal in an approximately uniform manner on a surface of the silicon-containing substrate;
    (b) performing a process to cause the first metal to agglomerize, the process resulting in the surface of the silicon-containing substrate being bare except in portions covered by nanoparticles formed by agglomorization of the first metal;
    (c) depositing a layer of a second metal on top of the nanoparticles and the surface of the silicon-containing substrate that is bare except in the portions covered by the nanoparticles in such a way that areas of bare or sparsely covered silicon are produced in the vicinity of the nanoparticles between the nanoparticles and the layer of second metal deposited on the silicon-containing substrate; and
    (d) contacting the metallized substrate with an etchant aqueous solution comprising about 2 to about 49 weight percent HF and an oxidizing agent, wherein the process causes etching to occur in areas touched by the nanoparticles and in areas touched by the second metal.

2. The process of claim 1, wherein the first metal comprises silver.

3. The process of claim 1, wherein the second metal comprises silver.

4. The process of claim 1, wherein the first and second metal are substantially identical.

5. The process of claim 1, wherein agglomerizing is performed at least partly in a sputtering tool.

6. The process of claim 1, wherein agglomerizing results in balls comprising the first metal.

7. The process of claim 1, wherein the step of agglomerizing comprises heating a layer of deposited first metal.

8. The process of claim 7, wherein the heating of the first layer involves subjecting the substrate to temperatures in a range between about 200° C. and about 400° C.

9. The process of claim 8, wherein the heating of the first layer involves subjecting the substrate to temperatures in the range for a time between about 2 and about 10 minutes.

10. The process of claim 1, wherein step (a) of depositing the first metal comprises sputtering.

11. The process of claim 1, wherein prior to step (a) a UV-ozone clean process is performed.

12. The process of claim 11, wherein step (a) is initiated no more than about 10 minutes after the UV-ozone clean process.

13. The process of claim 1, wherein the oxidizing agent of step (d) comprises H2O2 or oxygen bubbled through a perforated tube.

14. A process for creating a nanosized pattern of a first metal on a silicon surface, comprising the steps of:
    depositing the first metal directly on the silicon surface;
    annealing the deposited first metal so as to produce a nanosized pattern of nanoparticles comprising round deposits and elongated deposits with a worm-like shape covering the surface, the silicon surface being bare except in portions covered by the nanoparticles; and
    employing the nanosized pattern for the formation of other nanostructures by means of additional processing, the additional processing including:
    depositing a layer of a second metal on top of the nanoparticles and the silicon surface that is bare except in portions covered by the nanoparticles in such a way that areas of bare or sparsely covered silicon are produced in the vicinity of the nanoparticles between the nanoparticles and the layer of second metal deposited on the silicon; and
    contacting the metallized substrate with an etchant aqueous solution comprising about 2 to about 49 weight percent HF and an oxidizing agent,
    wherein the process causes etching to occur in areas touched by the nanoparticles and in areas touched by the second metal.

15. The process of claim 14, wherein the first metal and second metal are substantially identical.

* * * * *